United States Patent [19]

Mizuoka et al.

[11] Patent Number: 5,195,055

[45] Date of Patent: Mar. 16, 1993

[54] SERIAL DATA INPUT CIRCUIT FOR THE SHIFTING-IN OF VARIABLE LENGTH DATA

[75] Inventors: Hisako Mizuoka; Yukihiko Shimazu, both of Itami, Japan

[73] Assignee: Mitsubishi Denki Kabushiki Kaisha, Tokyo, Japan

[21] Appl. No.: 833,562

[22] Filed: Feb. 6, 1992

Related U.S. Application Data

[63] Continuation of Ser. No. 492,278, Mar. 6, 1990, abandoned, which is a continuation of Ser. No. 159,865, Feb. 24, 1988, abandoned.

[30] Foreign Application Priority Data

Nov. 30, 1987 [JP] Japan .................................. 62-303682

[51] Int. Cl.$^5$ .............................. G11C 7/00; G06F 5/04
[52] U.S. Cl. ................................. 365/78; 365/189.05; 365/221
[58] Field of Search ................. 365/73, 75, 78, 189.05, 365/189.12, 194, 221; 377/64, 67, 73, 75

[56] References Cited

U.S. PATENT DOCUMENTS 4,283,620 8/1981 Drescher et al. ................. 365/78 X
4,953,128 8/1990 Kawai et al. ................ 365/189.12 X

FOREIGN PATENT DOCUMENTS 3634657 4/1987 Fed. Rep. of Germany ........ 365/78
0094589 7/1981 Japan ..................................... 365/78

OTHER PUBLICATIONS

Research Disclosure, Jul. 1985 No. 255, Variable Length Feedback Shift Register.
"A High-Performance Digital Signal Processor VLSI: MN1900 Series," Ueda et al, presented at Tokyo ICASSP 1986.

Primary Examiner—Joseph A. Popek
Attorney, Agent, or Firm—Townsend & Townsend

[57] ABSTRACT

A serial data input circuit of this invention which, at the time of inputting of serial data, stores a predetermined signal represented in the bit outputted from the output side of the shift register when the last bit of serial data is inputted into the input side of a shift register and signals other than the predetermined signal in other bits respectively, so that, when all the bits of serial data are inputted into the shift register, the predetermined signal is outputted from the shift register, thereby realizing the circuit of small-sized, of simple in circuitry construction without a counter or the like.

10 Claims, 6 Drawing Sheets

SERIAL DATA INPUT CIRCUIT FOR THE SHIFTING-IN OF VARIABLE LENGTH DATA

This is a continuation of application Ser. No. 07/492,278 filed Mar. 6, 1990, now abandoned, which is a continuation of application Ser. No. 159,865, filed Feb. 24, 1988, now abandoned.

BACKGROUND OF THE INVENTION

1. Field of the Invention

The present invention relates to a serial data input circuit incorporated for use mainly in a microprocessor having a serial data input-output port or in an integrated circuit for communication.

2. Description of the Prior Art

An input circuit for the serial data is a circuit through which, for example, a micro-processor or an integrated circuit for communication, fetches the serial data from the exterior and converts it into parallel data.

Figure 1:
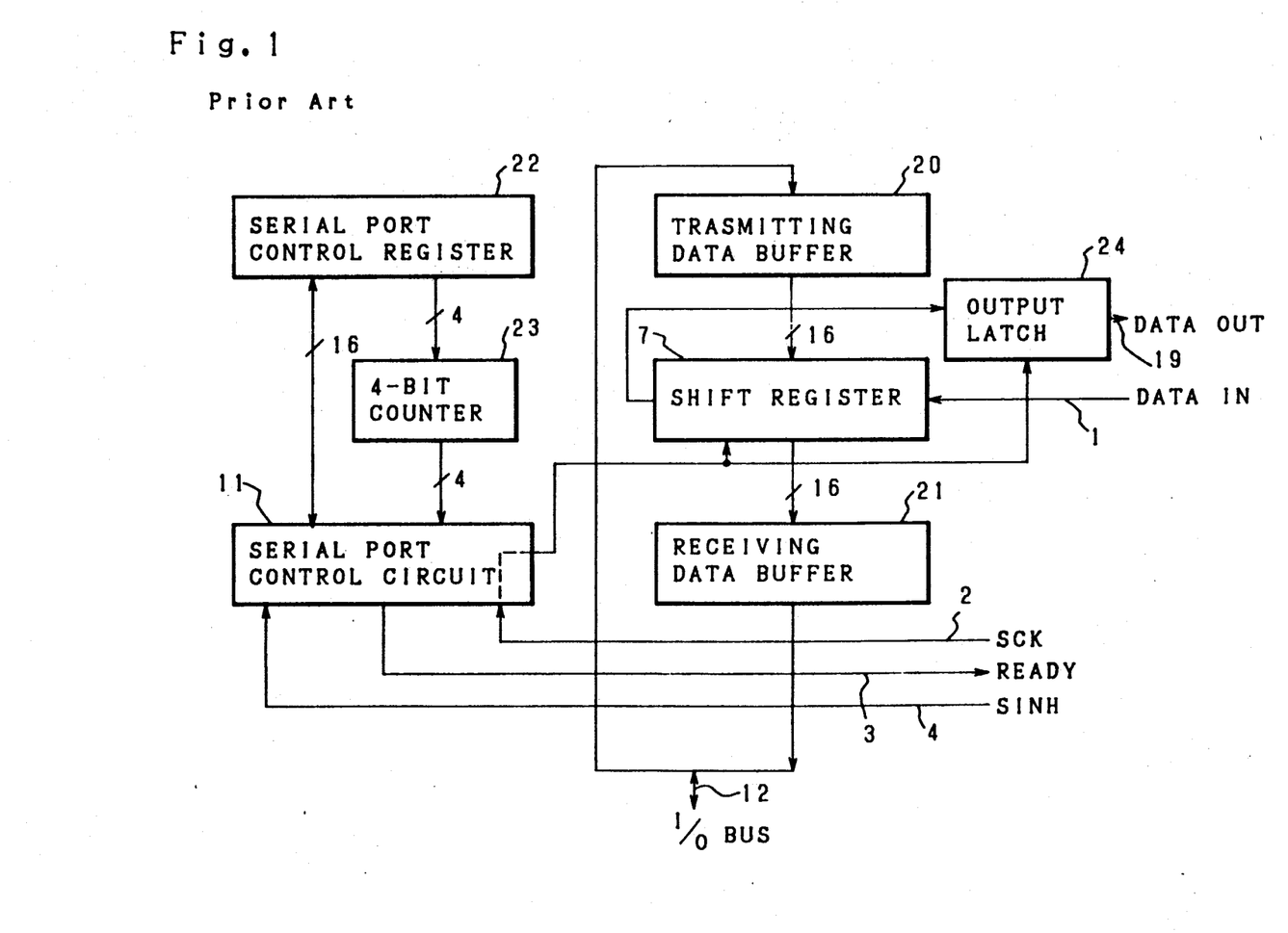
FIG. 1 is a block diagram of the conventional serial data input circuit.

For example, such serial data input circuit of conventional construction is disclosed in the "Digital Signal Processor MN1901/MN1909 User's Manual" issued by Matsushita Electronic Co., which is shown in a block diagram in FIG. 1.

In the drawing, a reference numeral 1 designates an input signal line for serial data DATAIN to be introduced, the input serial data DATAIN being given to a shift register 7 through the input signal line 1 and once stored in the shift register 7, 2 designates an input signal line of a serial clock SCK so that the serial clock SCK is given to a serial port control circuit 11 through the input signal line 2 from the exterior of the processor incorporating therein the serial data input circuit, 3 designates an output signal line for a serial port (input) ready signal READY so that the serial port ready signal READY indicating that the serial data is in condition of enabling the input of serial data is outputted from a serial port control circuit 11 through the signal line 3, and 4 designates a signal line for a serial input control signal SINH. Through the signal line 4, the serial input control signal SINH for input control of serial data is introduced into the serial port control circuit 11.

The shift register 7 is given a serial clock SCK through the serial port control circuit 11, so that the input serial data DATAIN given from the signal line 1, while being shifted-in sequentially in unit of one bit with the serial clock SCK being as the shift clock, is stored in the shift register 7. The serial data once stored in the shift register 7, in this example, is transferred as parallel data of 16 bits to a receiving data buffer 21 and received thereby as input data through an I/O bus 12.

Also, a reference numeral 20 designates a transmitting data buffer. Data, when transmitted, is once stored in the transmitting data buffer 20 through the I/O bus 12 and thereafter stored as the parallel data of 16 bits in the shift register 7, the parallel data being outputted as output serial data DATAOUT to the exterior from an output signal line 19 through an output latch 24 sequentially one bit at a time by use of the serial clock SCK as the shift clock.

A serial port control register 22 stores therein the serial data to be introduced, that is, bit number of the input serial data DATAIN in other words, data length, given as 4-bit counter 23.

The 4-bit counter 23, when the 4-bit data indicating data length and stored in the serial port control register 22 as above-mentioned is initially set and the serial port control circuit 11 controls the shift resister 7 to start input of the input serial data DATAIN therein, decrements a count value one by one per one bit of the input serial data DATAIN to thereby give the value to the serial port control circuit 11.

Accordingly, the serial port control circuit 11, when it detects the count value of the 4-bit counter becomes zero, concretely, the 4-bit signal of the count value becomes a logical "0000", stops input of the input serial data DATAIN into the shift register 7, thereby controlling the input of serial data. When the output serial data DATAOUT is outputted, the operation is similar to the above.

Figure 2:
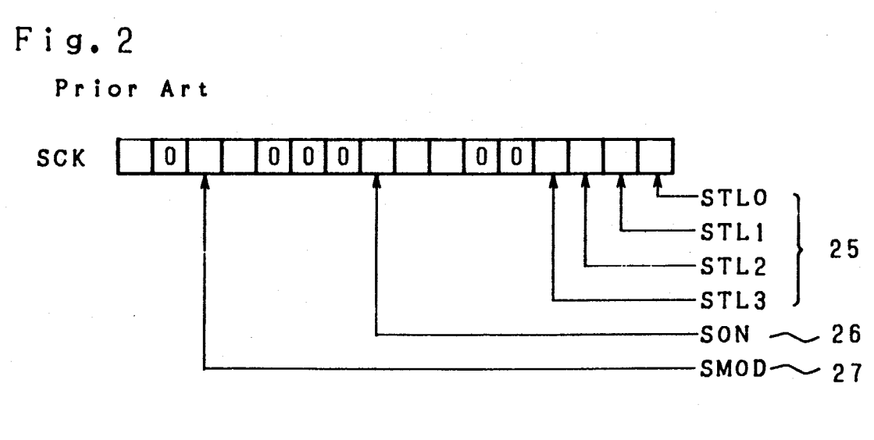
FIG. 2 is a view exemplary of field structure of controlling data of a serial port control circuit at the serial data input circuit shown in FIG. 1.

FIG. 2 is a typical view showing the field of the serial port control register 22.

In the drawing, a reference numeral 25 is the field into which the data length (bit number) of the input serial data DATAIN or the output serial data DATAOUT is written, the field comprising four bits of STL0 to STL3 as abovementioned.

Also, an SON field 26, when a logical "1" is written therein, shows the start of use for the serial port, and at an SMOD field 27, when a logical "0", the end of serial data is recognized by the count value of the 4-bit counter 23 and, when a logical "1", it is recognized by the trailing edge of the serial input control signal SINH given from the exterior.

Such operation of the conventional circuit is as follows:

Data length of data to be transmitted and received is previously written in the fields STL0 to STL3 at the serial port control register 22. In a case where the field SMOD is a logical "0", when the serial input control signal SINH and serial port ready signal READY each are assumed to be a logical "1", so as to rewrite the field SON from a logical "0" to "1", values of the fields STL0 to STL3 are loaded on the 4-bit counter 23.

The input serial data DATAIN is introduced into the shift register 7 synchronizing with the serial clock SCK while being shifted one bit at a time and simultaneously the 4-bit counter 23 performs down-count of serial clock SCK.

When the number of pulse at an input signal line 2 is counted down to zero, the serial port control circuit 11 changes the serial port ready signal READY from a logical "1" to "0" to thereby inform to the exterior of end of data transfer.

Thus, the serial data of desired bit length in the range of 1 to 16 bits can be transferred. However, in a case where the field SMOD is a logical "1", when the serial input control signal SINH rises even before the count value of 4-bit counter 23 becomes a logical "0", the serial port ready signal READY is enforced to be a logical "0", so that the 4-bit counter 23 is forcibly cleared to stop the input of data.

In the aforesaid circuitry, the 4-bit counter 23 is required for counting the serial clock signal SCK and also the serial port control circuit 11 requires a circuit which detects that the count value of the 4-bit counter 23 is zero, that is, the value of 4-bit becomes a logical "0000". As a result, a problem is created in that the circuitry and control thereof are complicated and the member of components increases to thereby enlarge an occupied area when the data input circuit is laid out as an actual circuit on the chip.

SUMMARY OF THE INVENTION

The present invention has been designed to solve the above problem. An object of the invention is to provide a serial data input circuit easy to control and smaller enough in an occupied area when laid out as the actual circuit on the chip.

The serial data input circuit of this invention having a shift register which is inputted serial data into an input side first unit latch, sequentially shifts said serial data to adjacent unit latch synchronizing with a shift clock, and outputs said serial data from an output side unit latch, is provided with; a data length register for storing therein a data length of said serial data to be inputted into said shift register and storing a predetermined signal in the unit latch whose order from said output side unit latch of said shift resister is corresponding to the data length of said serial data; and a circuit for detecting the completion of the input of said serial data into said shift register by the outputting of said predetermined signal from said output side unit latch when said serial data is inputted into said shift register.

The above and further objects and features of the invention will more fully be apparent from the following detailed description with accompanying drawings.

DESCRIPTION OF THE PREFERRED EMBODIMENTS

Next, the present invention will be detailed in accordance with embodiments of a serial data input circuit of the invention shown in the drawings.

Figure 3:
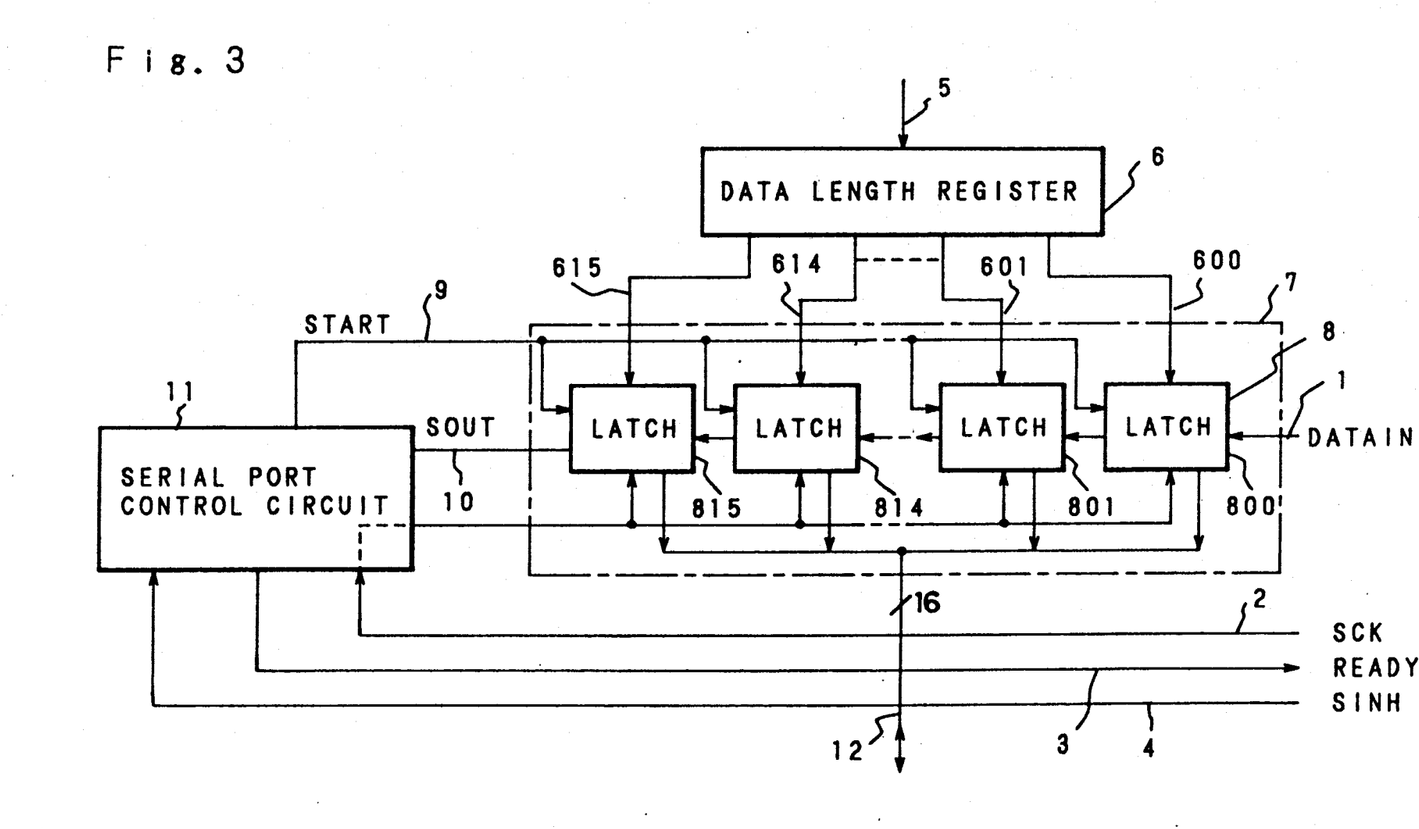
FIG. 3 is a block diagram of a serial data input circuit of the present invention.

FIG. 3 is a block diagram of a serial data input circuit of the invention.

In FIG. 3, the components the same as or corresponding to those in FIG. 1 are designated by the same reference numerals.

In the drawing, reference numerals 1, 2, 3 and 4, in the same way as the prior art, designate signal lines for input serial data DATAIN, a serial clock SCK, a serial port ready signal READY and a serial input control signal SINH respectively.

The signal line 1 is connected to a latch 800 at the first stage (the input side) of a shift register 7 comprising a plurality (in this embodiment, corresponding to 16 bits) of unit latches 8 and the input serial data DATAIN is introduced in the first stage latch 800.

The signal line 2 is connected to a serial port control circuit 11, whereby the serial clock SCK is given to the respective latches 8 at the shift register 7 through the serial port control circuit 11.

The signal line 3 outputs therethrough the serial port ready signal READY from the serial port control circuit 11 to the exterior.

The serial port ready signal READY is controlled by the serial port control circuit 11 to be a logical "1" when the shift register 7 is empty (without the serial data) and to be a logical "0" when the shift register 7 is completely given the input serial data DATAIN and full of data.

The signal line 4 applies therethrough the signal input control signal SINH from the exterior to the serial port control circuit 11. The input serial data DATAIN is inhibited from being inputted into the serial port control circuit 11 during the period of keeping the serial input control signal SINH to be a logical "1".

The shift register 7 in this embodiment as above-mentioned comprises 16 sets of unit latches 8 corresponding to 16 bits. The latches 800 through 815 in the order from the first stage latch 800 directly connected to the signal line 1 to the last stage one 815 use as the shift clock the serial clock SCK given from the serial port control circuit 11, thereby carrying out the shift latch for the input serial data DATAIN. The data stored in each unit latch 8 is outputted from the last stage latch 815 while being sequentially shifted, the output thereof being given as a shift-out signal SOUT to the serial port control circuit 11 through a signal line 10.

In addition, a reference numeral 9 designates a signal line through which a serial input start signal START is given from the serial port control circuit 11 to the respective latches 800 through 815.

A reference numeral 6 designates a data length register, in which a data length of the input serial data DATAIN to be introduced into the circuit of the invention is set from the exterior through a data bus 5. The data length register 6 makes data length signals, only one of which is a logical "1" and the other are logical "0". The logical "1" indicates the end of the input of serial data when it appears at the shift-out signal SOUT on the signal line 10. The data length signal are loaded into each latch 8 of the shift register 7 in parallel before input serial data DATAIN is shifted in.

The data length signal is of 16 bits, in which when a bit length of input serial data DATAIN is i-bit, a bit corresponding to the $17-i$ ($=16-i+1$)th stage latch is alloted as the shift-out signal bit to the signal of logical "1" and bits corresponding to other latches to a logical "0" respectively, for example, such as the last stage latch 815 when the input serial data DATAIN is 1-bit length and the latch 814 one before the last stage latch 815 when the input serial data DATAIN is 2-bits length.

Figure 4:
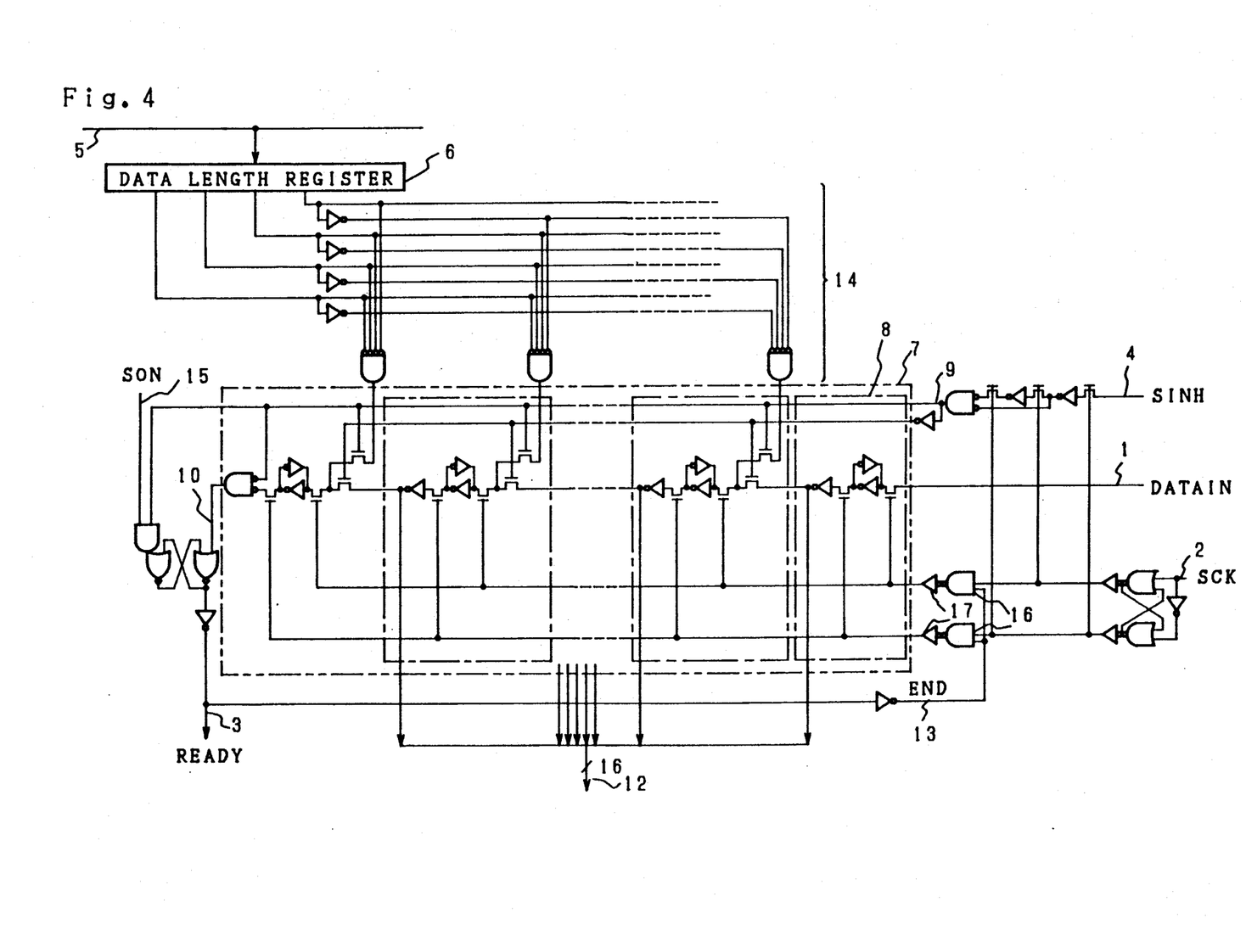
FIG. 4 is a concrete logical circuit diagram thereof.

FIG. 4 is a concrete logical circuit diagram of the circuit of the invention shown in FIG. 3, in which the components are designated by the same reference numerals as those in FIG. 3.

In addition, in FIG. 4, a reference numeral 13 designates a signal line for a serial data input end signal END, 14 designates a data length signal decoder circuit attached to the shift register 7, and 15 designates a signal line for a serial port on signal SON.

Next, explanation will be given on an operation of the circuit of the invention with reference to a timing chart in FIG. 5.

Preliminarily, a data length of the input serial data DATAIN to be introduced is set at the data length register 6 through the data bus 5, the setting being desirably changeable by the control program, for example, which is previously stored in a microprocessor being provided with the serial data input circuit of this invention.

Figure 5:
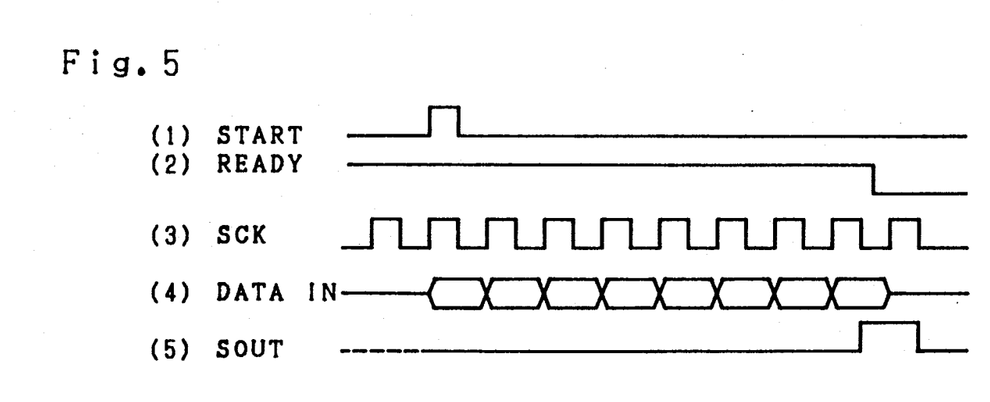
FIG. 5 is a timing chart explanatory of operation of the circuit of the invention shown in FIG. 3.

Next, when the serial input control signal SINH indicating the start of input of the serial data, turns to a logical "1", the serial port control circuit 11, turns the serial input start signal START to a logical "1", as shown in FIG. 5-(1), and gives it to the respective unit latches 8 at the shift register 7 through the signal line 9.

The respective latches 800 to 815 at the shift register 7 are given the serial input start signal START, thereby reading the signal of the bit corresponding to each bit length signal generated and held by the data length register 6. Hence, the initial setting of shift register 7 is completed.

Then, the input serial data DATAIN synchronizing with the serial clock SCK as shown in FIG. 5-(3) starts and it is introduced into the shift register 7 as shown in FIG. 5-(4).

At first, when a first bit of the input serial data DATAIN is introduced into the first stage latch 800, the signal of "0" (or "1") stored in the last stage latch 815 is outputted to the serial port control circuit 11. And, when each bit of the input serial data DATAIN is introduced sequentially to the first stage latch 800 of the shift register 7, each bit of the bit length signal previously initially set at each latch 8 of the shift register 7 is outputted sequentially from the last stage latch 815 to the serial port control circuit 11.

Accordingly, assuming that the input serial data DATAIN is of, for example, 8-bit length, at the 9(=16−8+1)th stage latch 808 is initially set the signal of logic "1," whereby at the point of time when the eighth bit (the last bit) of input serial data DATAIN is introduced into the first stage latch 800, the signal of logical "1" initially set at the 9th stage latch 808, as shown in FIG. 5-(5), is given to the serial port control circuit 11 as the shift out signal SOUT through the signal line 10. Hence, the serial port control circuit 11 detects that the input serial data DATAIN of 8-bits is completely introduced into the shift register 7, thereby turning the serial port ready signal READY from a logical "1" to "0" as shown in FIG. 5-(2).

When the serial data input end signal END which is the negative signal of the serial port ready signal READY becomes logical "0", the serial clock SCK is inhibited to be supplied to the shift register 7 by a NAND gate 16 and an inverter 17. Hence, as for as the serial input control signal SINH is not turned to a logical "1", and signal READY is not turned to a logical "1", the input serial data DATAIN is inhibited from further input into the shift register 7.

Also, it is of course possible to merely output the serial port ready signal READY as the serial data input end signal END without taking the logical product with the serial clock SCK by NAND gate 16 and inverter 17.

Figure 6:
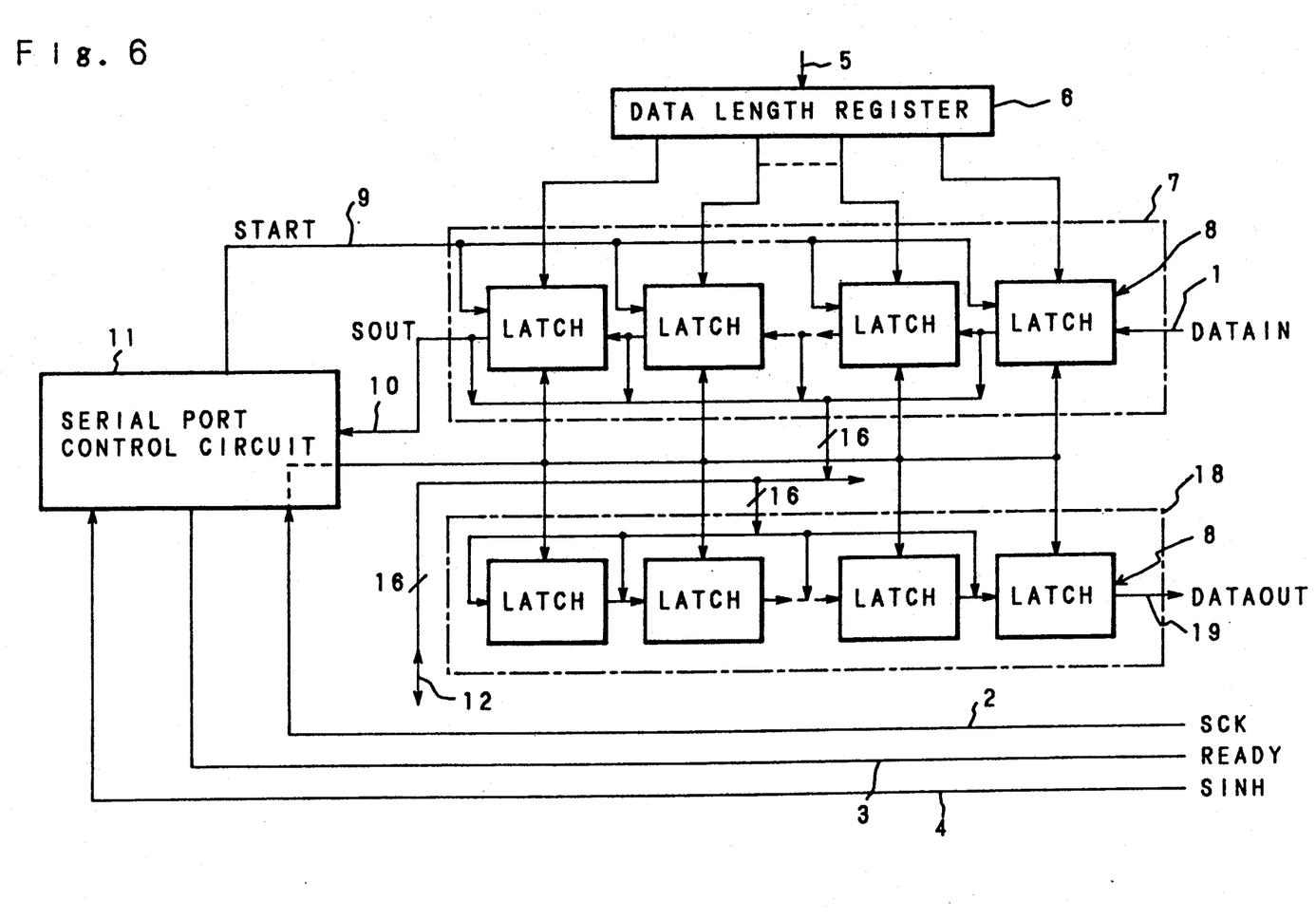
FIG. 6 is a block diagram of a modified embodiment of the serial data input circuit of the invention.

FIG. 6 is a block diagram of a modified embodiment of the invention, which is adapted to output data of the same number of bits during the input execution of the input serial data DATAIN.

In this embodiment, in addition to construction shown in FIG. 3, a data output shift register 18 of the same construction as the data input shift register 7. Parallel output serial data DATAOUT is previously introduced into the data output shift register 18 through an I/O bus 12, so that the serial clock SCK given for fetching the input serial data DATAIN into the shift register 7 is adapted to be given simultaneously to each latch 8 at the data output shift register 18.

Accordingly, when the output serial data DATAOUT is previously stored in the data output shift register 18 before the input serial data DATAIN is fetched into the shift register 7, each time the shift register 7 is given the serial clock SCK, the data output shift register 18 sequentially outputs the output serial data DATAOUT to a signal line 19 in unit of 1 bit.

In addition, the aforesaid embodiments make the 16-bit serial data an object of processing, which is not limited so, but can make a 8-bit or 32-bit serial data an object of processing.

As seen from the above, the present invention can constitute the serial data input circuit relatively simple in construction in comparison with the conventional, thereby being effective in that an occupied area on the chip need only be smaller in layout of the actual circuit.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A serial data input circuit having a shift register including a set of serially connected unit latches where data of variable bit lengths are shifted into an input side first unit latch, said data of variable bit lengths including at least input serial data having a first data length and where the shifting of data is synchronizing to a shift clock signal comprising:

a data length register for receiving and storing a data length digital word having sequential bit positions corresponding to the positions of the unit latches in the shift register, where a position indicating bit at a predetermined bit position in said data length word is set to a first binary state and all other bit positions in said data length word are set to a second binary state;

means for transferring said data length word from said data length register to said shift register prior to shifting said input serial data into the shift register, with bits in corresponding bit positions of said data length digital word transferred to corresponding unit latches of said shift register;

a circuit for serially shifting said data length digital word and said input serial data a number of bits equal to said first data length through said shift register toward an output side unit latch of said shift register, said input serial data and said data length digital word are shifted simultaneously and in synchronism with said shift clock signal; and a circuit for detecting the completion of the input serial data inputted into said shift register by the outputting of said position indicating bit by said output side unit latch, said position indicating bit being outputted by said output side unit latch at a time when none of said input serial data has been serially outputted through said output side unit latch.

2. A serial data input circuit as set forth in claim 1, wherein said data length register is coupled to a data bus for receiving said data length digital word indicating said first data length.

3. A serial data input-output circuit having a serial data input shift register including a first plurality of serially connected unit latches and a serial data output shift register including a second plurality of serially connected unit latches, where data of variable bit lengths are shifted into an input side first unit latch of said serial data input shift register and at least portions of the contents of said serial data input shift register are shifted out of an output side last unit latch of said serial data input shift register, said data of variable bit lengths including at least input serial data having a data length, said serial data output shift register including an output side last unit latch, said serial data output shift register outputting output data through an output side unit latch of said serial data output shift register, and where the shifting of said input serial data and said output data is synchronized to a shift clock signal, the circuit comprising:

I/O bus means for receiving said input serial data from said serial data input shift register and for outputting said output data to said serial data output shift register;

a data length register for storing therein a data length word indicating said data length;

a circuit for transferring at least a portion of said data length word, said portion having at least one indicator bit, from said data length register, to at least a predetermined unit latch of said serial data input shift register prior to shifting said input serial data into said serial data input shift register, with said predetermined unit latch being a latch whose contents will be shifted out through said output side last unit latch when all of said first data is shifted in to said input side first unit latch;

means, responsive to the output of said indicator bit from said output side last unit latch of said serial data input shift register, for inhibiting the supply of said shift clock signal to said serial input and output shift registers when said indicator bit is output from said output side last unit latch of said serial data input shift register wherein said data length register is coupled to a data bus for receiving said data length word.

4. A serial data input circuit having a shift register including a set of serially connected unit latches where data input signals of variable bit lengths are shifted into an input unit latch and shifted out of an output unit latch and where the shifting of data is synchronized to a shift clock signal comprising:

a data length register for receiving and storing a data length digital word having sequential bit positions corresponding to the positions of the unit latches in the shift register, where a position indicating bit at a predetermined bit position in said data length word is set to a first binary state and all other bit positions in said data length word are set a second binary state;

means for transferring said data length word from said data length register to said shift register prior to shifting a data input signal into the shift register, with bits in corresponding bit positions of said data length digital word transferred to corresponding unit latches of said shift register;

means for concurrently shifting a data input signal into said shift register and shifting said transferred data length word out of said shift register through said output unit latch; and control means, connected to said output unit latch, for stopping the shifting in of said data input signal when said position indicating bit is shifted out of the output unit latch so that the location of said predetermined bit position controls the number of bits of said data input signal that are shifted into the shift register.

5. A serial data input-output circuit having a serial data input shift register including a first plurality of serially connected unit latches and a serial data output shift register including a second plurality of serially connected unit latches, where data of variable bit lengths are shifted into an input side first unit latch of said serial data input shift register and at least portions of the contents of said serial data input shift register are shifted out of an output side last unit latch of said serial data input shift register, said data of variable bit lengths including at least input serial data having a data length, said serial data output shift register including an output side last unit latch, said serial data output shift register outputting output data through an output side unit latch of said serial data output shift register, and where the shifting of said input serial data includes sequentially shifting at least portions of said input serial data into N-number of said unit latches of said serial data input shift register in synchronism with a shift clock signal and the shifting of said output data includes sequentially shifting said output data to adjacent unit latches of said serial data output shift register in synchronism with said shift clock, the circuit comprising:

I/O bus means for receiving said input serial data from said serial data input shift register and for outputting said output data to said serial data output shift register;

a data length register for storing therein a data length word indicating said data length;

a circuit for transferring at least a portion of said data length word, said portion of said data length word having at least one indicator bit, from said data length register, to at least a predetermined unit latch of said serial data input shift register prior to shifting said input serial data into said serial data input shift register, with said predetermined unit latch being a latch whose contents will be shifted out through said output side last unit latch when all of said first data is shifted in to said input side first unit latch;

wherein said input serial data is inputted into said input shift register and said output data is outputted from said serial data output shift register before said indicator bit is outputted from the output side last unit latch of said input shift register and wherein further inputting of said input serial data into said input shift register and further outputting of said output data from said output shift register are inhibited when said indicator bit is outputted from the output side last unit latch of said serial data input shift register.

6. A serial data input-output circuit having a serial data input shift register including a first plurality of serially connected unit latches and a serial data output shift register including a second plurality of serially connected unit latches, where data of variable bit lengths are shifted into an input side first unit latch of said serial data input shift register and at least portions of the contents of said serial data input shift register are shifted out of an output side last unit latch of said serial data input shift register, said data of variable bit lengths including at least input serial data having a data length, said serial data output shift register including an output side last unit latch, said serial data output shift register outputting output data through an output side unit latch of said serial data output shift register, and where the shifting of said input serial data and said output data is synchronized to a shift clock signal, the circuit comprising:

I/O bus means for receiving said input serial data from said serial data input shift register and for outputting said output data to said serial data output shift register;

a data length register for storing therein a data length word indicating said data length;

a circuit for transferring at least a portion of said data length word, said portion of said data length word, having at least one indicator bit, from said data length register, to at least a predetermined unit latch of said serial data input shift register prior to shifting said input serial data into said serial data input shift register, with said predetermined unit latch being a latch whose contents will be shifted out through said output side last unit latch when all of said input serial data is shifted in to said input side first unit latch;

means, responsive to the output of said indicator bit from said output side last unit latch of said serial data input shift register, for inhibiting the supply of said shift clock signal to said serial input and output shift registers when said indicator bit is output from said output side last unit latch of said serial data input shift register.

7. A serial data input circuit having a shift register comprising N unit latches which inputs serial data of variable length from a data input line into an input side first unit latch thereof and sequentially shifting said serial data in said shift register to adjacent unit latches thereof and synchronizing said shifting with a shift clock signal comprising:

a data length register for storing therein a data word indicative of a data length of said serial data to be inputted into said shift register;

a circuit for transferring, before the start of serial data input, initial values from said data length register into said N unit latches adjacent to each other so that one of said initial values which indicates the completion of the input of said serial data from said data input line, is transferred into one of said unit latches whose order from an output side last unit latch of said shift register corresponds to said data length and said one of said initial values is outputted from said output side last unit latch of the shift register when the input of said serial data having said data length is completed; and a circuit for shifting said initial values and input serial data through said shift register toward the output side unit latch of said shift register, said serial data and said data word are shifted simultaneously and in synchronism with said shift clock signal, and for detecting the completion of the serial data inputted into said shift register by the outputting of said one of said initial values.

8. A serial data input-output circuit as claimed in claim 5, wherein said N-number of unit latches of said serial data input shift register includes at least a first latch, being said input side first unit latch, and an Nth latch, being said output side last unit latch and wherein said data length is represented by a letter i wherein i is less than or equal to N, and whrrein said predetermined unit latch is the (N−i+1)th unit latch.

9. A serial data input-output circuit as claimed in claim 5, further comprising means for inhibiting further input of said first data input into said serial data input shift register and output of said third data output from said output shift register by inhibiting the supply of said shift clock to said input shift register and said output shift register.

10. A method for serially shifting-in input data by operating apparatus which includes a shift register having N adjacent unit latches, including at least a first unit latch and an Nth unit latch, a data length register, coupled to said shift register and a serial port control circuit coupled to said shift register for receiving a bit from the Nth unit latch of said shift register after each shift of data in said shift register, said input data having a data length represented by a letter i, wherein i is less than or equal to N, the method comprising:

a) receiving, in said data length register, a data length word indicating said data length of said input data;

b) storing a first binary value in the (N−i+1)th unit latch of said shift register and storing a second binary value in all unit latches of said shift register other than said (N−i+1)th unit latch;

c) simultaneously shifting one bit of said input data into said first unit latch of said shift register, shifting a bit from said Nth unit latch of said shift register into said serial port control circuit and shifting contents of all unit latches of said shift register, except for said Nth unit latch, to an adjacent unit latch;

d) determining, in said serial port control circuit, the binary value of the bit shifted from said Nth unit latch into said serial port control circuit;

e) repeating steps c) and d) when said bit shifted from said Nth unit latch into said serial port control circuit has said second binary value; and f) inhibiting further shifting of said input data into said shift register when said bit shifted from said Nth unit latch into said serial port control circuit has said first binary value.

* * * * *